United States Patent
Nakaoka

(10) Patent No.: US 10,566,034 B1
(45) Date of Patent: Feb. 18, 2020

(54) MEMORY DEVICE WITH CONTROL AND TEST CIRCUIT, AND METHOD FOR TEST READING AND WRITING USING BIT LINE PRECHARGE VOLTAGE LEVELS

(71) Applicant: Winbond Electronics Corp., Taichung (TW)

(72) Inventor: Yuji Nakaoka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/045,759

(22) Filed: Jul. 26, 2018

(51) Int. Cl.
  *G11C 7/06* (2006.01)
  *G11C 29/02* (2006.01)
  *G11C 7/12* (2006.01)

(52) U.S. Cl.
  CPC .............. *G11C 7/06* (2013.01); *G11C 7/12* (2013.01); *G11C 29/021* (2013.01); *G11C 29/026* (2013.01)

(58) Field of Classification Search
  CPC ........................................................ G11C 7/06
  See application file for complete search history.

(56) References Cited

U.S. PATENT DOCUMENTS

| 5,140,553 A | * | 8/1992 | Choi | ................... | G11C 11/4072 |
| | | | | | 365/201 |
| 5,384,784 A | * | 1/1995 | Mori | ...................... | G11C 29/34 |
| | | | | | 702/118 |
| 5,548,596 A | * | 8/1996 | Tobita | ................... | G11C 29/34 |
| | | | | | 714/719 |
| 6,018,484 A | * | 1/2000 | Brady | ................... | G11C 29/34 |
| | | | | | 365/200 |
| 7,900,101 B2 | | 3/2011 | Jung | | |

(Continued)

FOREIGN PATENT DOCUMENTS

CN 100589208 2/2010
CN 1758382 10/2010

(Continued)

OTHER PUBLICATIONS

"Office Action of Japan Counterpart Application", dated Apr. 9, 2019, p. 1-p. 4.

(Continued)

*Primary Examiner* — Mushfique Siddique
(74) *Attorney, Agent, or Firm* — JCIPRNET

(57) ABSTRACT

A memory device and a method for test reading and writing thereof are provided. A precharge voltage control circuit is based on the precharge reference voltage to provide a first precharge voltage and a second precharge voltage. A sense amplifier circuit is coupled between a bit line and a complementary bit line and configured to sense data of a memory cell coupled to the bit line, and also coupled to the precharge voltage control circuit to make the bit line and the complementary bit line receive the first precharge voltage and the second precharge voltage respectively, the first precharge voltage and the second precharge voltage are on the same voltage level during the precharge operation, but during a test write sensing period and a test read sensing period after the precharge operation, the voltage levels of the first precharge voltage and the second precharge voltage are different.

18 Claims, 12 Drawing Sheets

(56) References Cited

U.S. PATENT DOCUMENTS

| | | | |
|---|---|---|---|
| 2002/0089879 A1* | 7/2002 | Kobayashi | G11C 7/12 |
| | | | 365/189.15 |
| 2006/0092735 A1* | 5/2006 | Do | G11C 7/065 |
| | | | 365/207 |
| 2006/0187728 A1* | 8/2006 | Funfrock | G11C 7/12 |
| | | | 365/203 |
| 2006/0291307 A1* | 12/2006 | Fujioka | G11C 29/10 |
| | | | 365/201 |
| 2008/0291763 A1* | 11/2008 | Mori | G11C 5/147 |
| | | | 365/203 |
| 2009/0231939 A1* | 9/2009 | Hsu | G11C 7/08 |
| | | | 365/210.12 |
| 2012/0075945 A1* | 3/2012 | Hess | G11C 7/12 |
| | | | 365/203 |
| 2017/0053696 A1 | 2/2017 | Jeong et al. | |
| 2017/0206944 A1 | 7/2017 | Kim | |

FOREIGN PATENT DOCUMENTS

| | | | |
|---|---|---|---|
| JP | H0312900 | | 1/1991 |
| TW | I264730 | | 10/2006 |
| TW | I 658466 B | * | 5/2019 |

OTHER PUBLICATIONS

"Office Action of Taiwan Counterpart Application," dated Dec. 14, 2018, p. 1-p. 5.

* cited by examiner

US 10,566,034 B1

MEMORY DEVICE WITH CONTROL AND TEST CIRCUIT, AND METHOD FOR TEST READING AND WRITING USING BIT LINE PRECHARGE VOLTAGE LEVELS

BACKGROUND OF THE INVENTION

Field of the Invention

The disclosure is related to a semiconductor memory technology, and more particularly, to a memory device capable of reading and writing all sense circuits on a selected word line at once in a parallel test mode and a method for test reading and writing thereof.

Description of Related Art

A common semiconductor memory device, such as a dynamic random access memory (DRAM), is configured with a sense amplifier which is connected to a bit line of a memory cell array and capable of accessing data from the selected memory cell and amplifying the data.

In the prior art, when a memory device is tested, for example in a parallel test mode, a plurality of amplifiers for normal reading and writing is selected at one time, but it is unachievable to select memory cells in a number of more than the data line for testing at one time. Therefore, how to select a plurality of sense amplifiers on a word line within one cycle to perform a parallel test mode has become one of the topics that are currently desired to be solved.

SUMMARY OF THE INVENTION

The disclosure is related to a memory device and a method for test reading and writing thereof, the memory device and the method are capable of selecting a plurality of sense amplifiers on a word line within one cycle to perform a parallel test mode.

A memory device, comprising a precharge voltage control circuit and a sense amplifier circuit is provided. A precharge voltage control circuit generates a first precharge voltage and a second precharge voltage based on a precharge reference voltage. A sense amplifier circuit is coupled between a bit line and a complementary bit line and is configured to sense a data of a memory cell coupled to the bit line, and the sense amplifier circuit is coupled to the precharge voltage control circuit for the bit line and the complementary bit line respectively receiving the first precharge voltage and the second precharge voltage, wherein in a precharge operation, a voltage level of the first precharge voltage and a voltage level of the second precharge voltage are the same, and during a test write sensing period and a test read sensing period after the precharge operation, a voltage level of the first precharge voltage and a voltage level of the second precharge voltage provided by the precharge voltage control circuit to the bit line and the complementary bit line are different.

A method for test reading and writing for a memory device, configured to perform a test write operation and a test read operation on a memory cell, the method for test reading and writing comprises the following. A first precharge voltage and a second precharge voltage are generated based on a precharge reference voltage. A bit line and a complementary bit line respectively receive the first precharge voltage and the second precharge voltage. In a precharge operation, a voltage level of the first precharge voltage and a voltage level of the second precharge voltage are the same, and during a test write sensing period and a test read sensing period after the precharge operation, a voltage level of the first precharge voltage and a voltage level of the second precharge voltage provided by the precharge voltage control circuit to the bit line and the complementary bit line are different.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
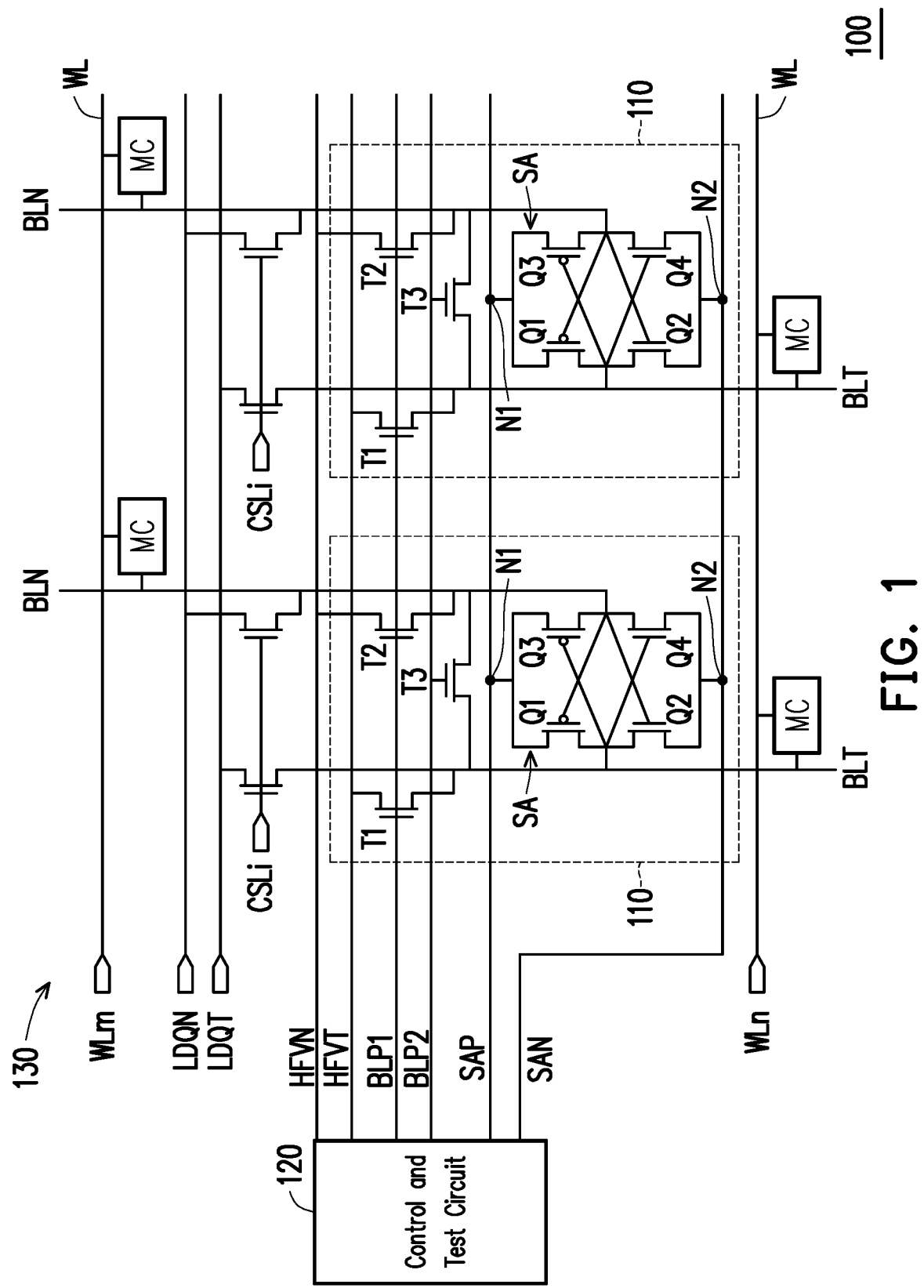
FIG. 1 is a schematic view of a memory device according to an embodiment of the disclosure.

Some other embodiments of the invention are provided as follows. It should be noted that the reference numerals and part of the contents of the previous embodiment are used in the following embodiments, in which identical reference numerals indicate identical or similar components, and repeated description of the same technical contents is omitted. Please refer to the description of the previous embodiment for the omitted contents, which will not be repeated hereinafter.

FIG. 1 is a schematic view of a memory device according to an embodiment of the disclosure. The memory device 100 includes a word line WL, a bit line BLT, a complementary bit line BLN, a memory cell MC, a sense amplifier circuit 110, and a control and test circuit 120. The control and test circuit 120 is coupled to the sense amplifier circuit 110 to provide a plurality of control signals.

The memory cell MC includes, for example, a memory capacitor for storing a data potential and a metal oxide semiconductor transistor (MOSFET) as a switch (not shown in the figures), wherein a first end of the metal oxide semiconductor transistor is coupled to the capacitor, a second end of the MOS transistor is coupled to the bit line BLT, and a gate of the MOS transistor is coupled to the word line WL. Herein, a plurality of memory cells MC are arranged in an array in a direction of a plurality of word lines WL and a plurality of bit lines BLT and a plurality of complementary bit lines BLN to form a memory array 130. In addition, a word line signal WLn and a word line signal WLm shown in FIG. 1 indicate signals on different word lines WL.

Being coupled to a pair of bit lines i.e. the bit line BLT and the complementary bit line BLN, the sense amplifier circuit 110 is adapted for sensing a data of the memory cell MC, such that a test write operation or a test read operation may be performed on the memory cell MC. A column select line signal CSLi is provided to the transistors to select one of the columns (the subscript i means the i-th column), and the data signals coupled to the bit line BLT and the complementary bit line BLN are the date signal LDQT and the complementary date signal LDQN, respectively.

The sense amplifier circuit 110 receives a first precharge voltage HFVT, a second precharge voltage HFVN, a first precharge enable signal BLP1 and a second precharge enable signal BLP2 from the control and test circuit 120. The sense amplifier circuit 110 determines whether to allow the bit line BLT and the complementary bit line BLN to respectively receive the first precharge voltage HFVT and the second precharge voltage HFVN or not according to the first precharge enable signal BLP1 and the second precharge enable signal BLP2. Herein, in a precharge operation, the first precharge voltage HFVT and the second precharge voltage HFVN have the same voltage level, so the bit line BLT has the same voltage level as the complementary bit line BLN. However, during the test write sensing period and the test read sensing period after the precharge operation, the voltage levels of the first precharge voltage HFVT and the second precharge voltage HFVN as provided by the control and test circuit 120 are different, and the time point for the first precharge enable signal BLP1 to switch the voltage level during the test write sensing period and the test read sensing period is also different. Therefore, unlike the general memory device, during the sensing process, the voltage difference between the bit line BLT and the complementary bit line BLN is mainly affected by the data released by the memory cell MC. In this embodiment, the voltage difference between the bit line BLT and the complementary bit line is related to the voltage difference between the first precharge voltage HFVT and the second precharge voltage HFVN. More detailed explanation will be provided in the following embodiments.

The sense amplifier circuit 110 includes a first switch T1, a second switch T2, a third switch T3 and a sense circuit SA. An n-channel transistor is herein taken as an example of the first switch T1, the second switch T2 and the third switch T3, but the disclosure is not limited thereto. A first end (drain) of the first switch T1 receives the first precharge voltage HFVT, a second end (source) of the first switch T1 is coupled to the bit line BLT, and a gate of the first switch T1 receives the first precharge enable signal BLP1 to determine whether the first switch T1 is turned on or not. A first end (drain) of the second switch T2 receives the second precharge voltage HFVN, a second end (source) of the second switch T2 is coupled to the complementary bit line BLN, and a gate of the second switch T2 also receives the first precharge enable signal BLP1 to determine whether the second switch T2 is turned on or not. The third switch T3 is coupled between the bit line BLT and the complementary bit line BLN, and a gate of the third switch T3 receives the second precharge enable signal BLP2.

The sense circuit SA is coupled between the bit line BLT and the complementary bit line BLN for amplifying the voltage difference between the bit line BLT and the complementary bit line according to a p-channel control voltage SAP and a n-channel control voltage SAN received from the control and test circuit 120. In this embodiment, the sense circuit SA is implemented by a CMOS inverter including two MOS transistors Q1 and Q2 and a CMOS inverter including two MOS transistors Q3 and Q4 connected as a flip-flop with a positive feedback.

A first end (source, in this case) of the transistor Q1 and the transistor Q3 of the sense circuit SA is coupled to a first intermediate node N1. The first intermediate node N1 receives the p-channel control voltage SAP, a second end (source, in this case) of the transistor Q2 and the transistor Q4 is coupled to a second intermediate node N2. The second intermediate node N2 receives the n-channel control voltage SAN. The other end (drain, in this case) of the transistor Q1 and the transistor Q2 of the sense circuit SA (drain, in this case) as well as a gate of the transistor Q3 and the transistor Q4 are coupled to the bit line BLT, and the other end (drain, in this case) of the transistor Q3 and the transistor Q4 as well as a gate of the transistor Q1 and the transistor Q2 are coupled to the complementary bit line BLN. As such, the voltage level of the bit line BLT and the complementary bit line BLN may be pulled up or pulled down to indicate the logic "1" or logic "0" by the influence of the p-channel control voltage SAP and the n-channel control voltage SAN.

Figure 2:
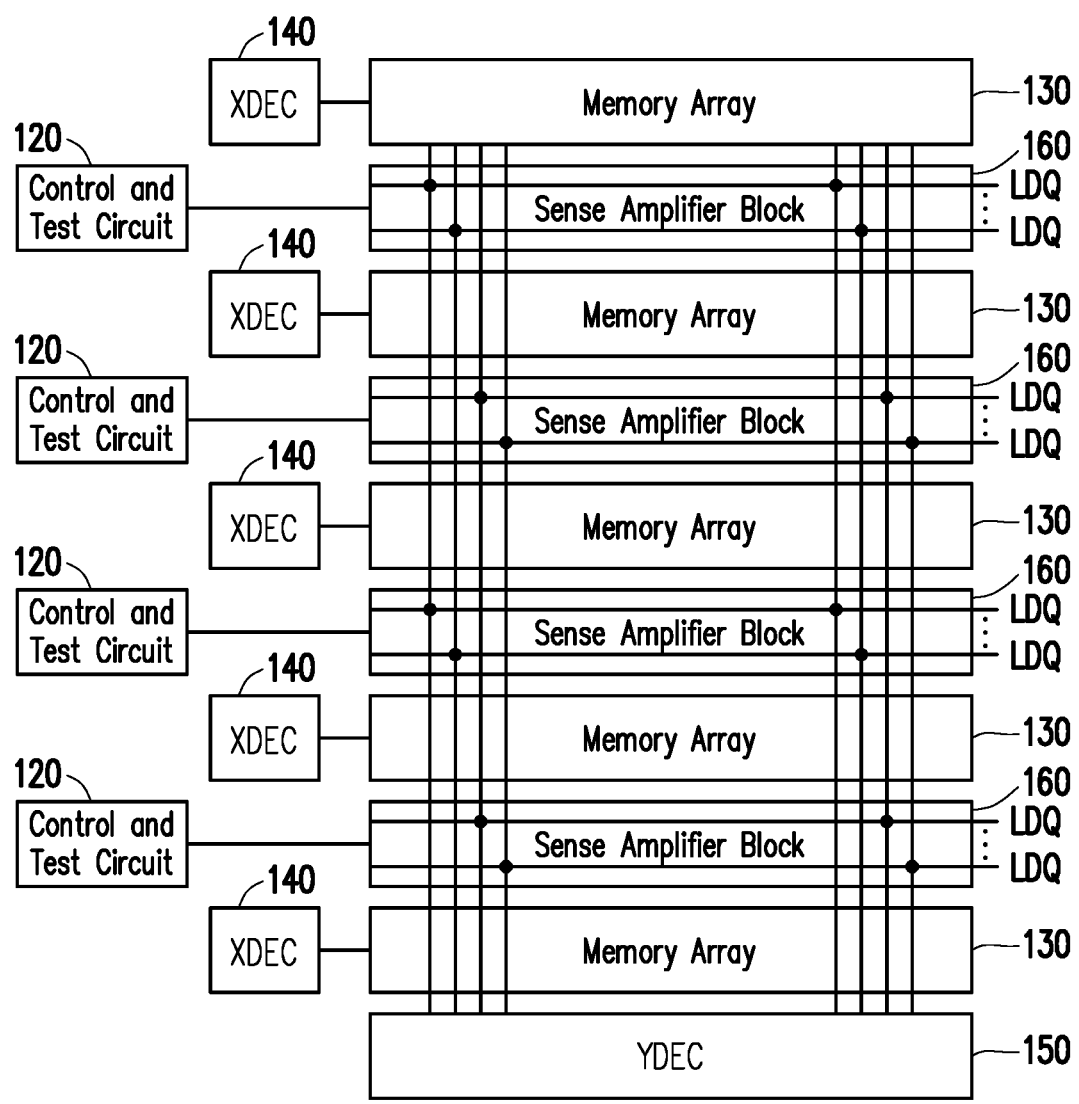
FIG. 2 is a schematic view of an array structure of a memory device according to an embodiment of the disclosure.

FIG. 2 is a schematic view of an array structure of a memory device according to an embodiment of the disclosure. A memory array 130 is composed of a memory cell MC at an intersection of a plurality of word lines WL and a plurality of bit lines BLT. An X decoder block (XDEC) 140 and a Y decoder block (YDEC) 150 are coupled to the memory array 130 for selecting to access the data from which memory cell MC. The memory array 130 is coupled to a sense amplifier block 160. The sense amplifier block 160 is coupled to the control and test circuit 120. The sense amplifier block 160 includes a plurality of sense amplifier circuits 110 described above. The signals LDQ include the date signals LDQT and the complementary date signals LDQN. The configuration relationship between the control and test circuit 120 and the plurality of sense amplifier circuits 110 of the sense amplifier block 160 is with reference to the disclosure of FIG. 1 above.

Figure 3:
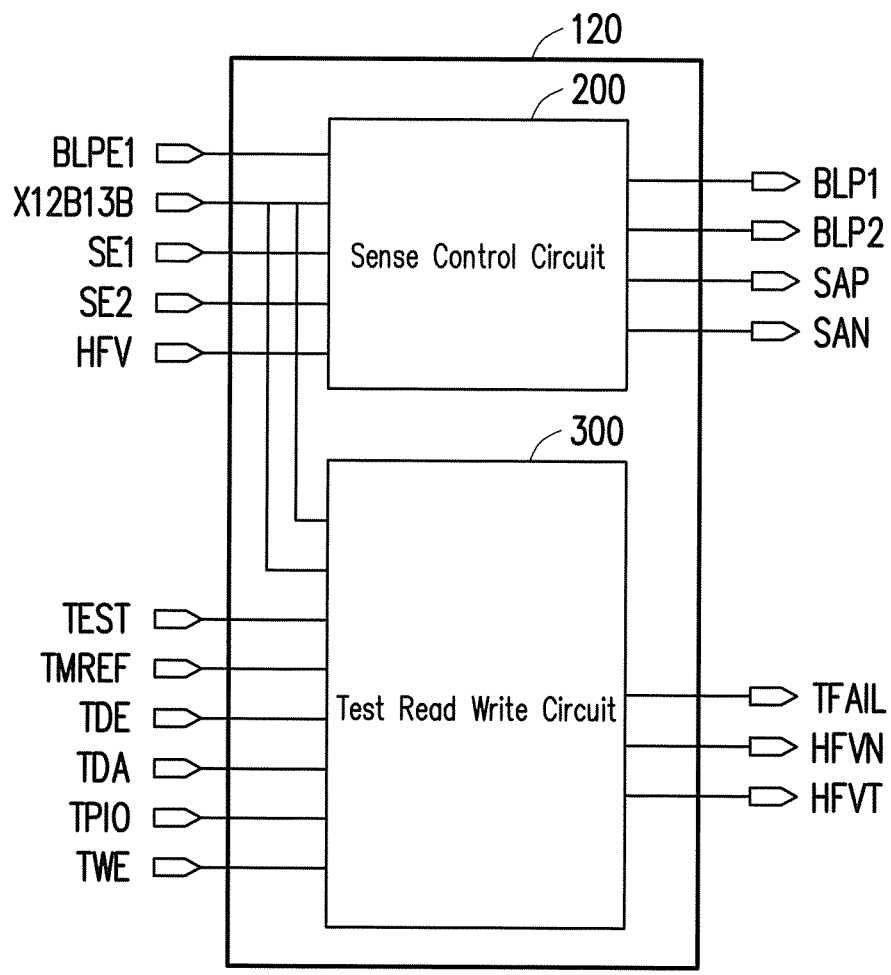
FIG. 3 is a schematic block diagram of a control and test circuit according to an embodiment of the disclosure.
Figure 4:
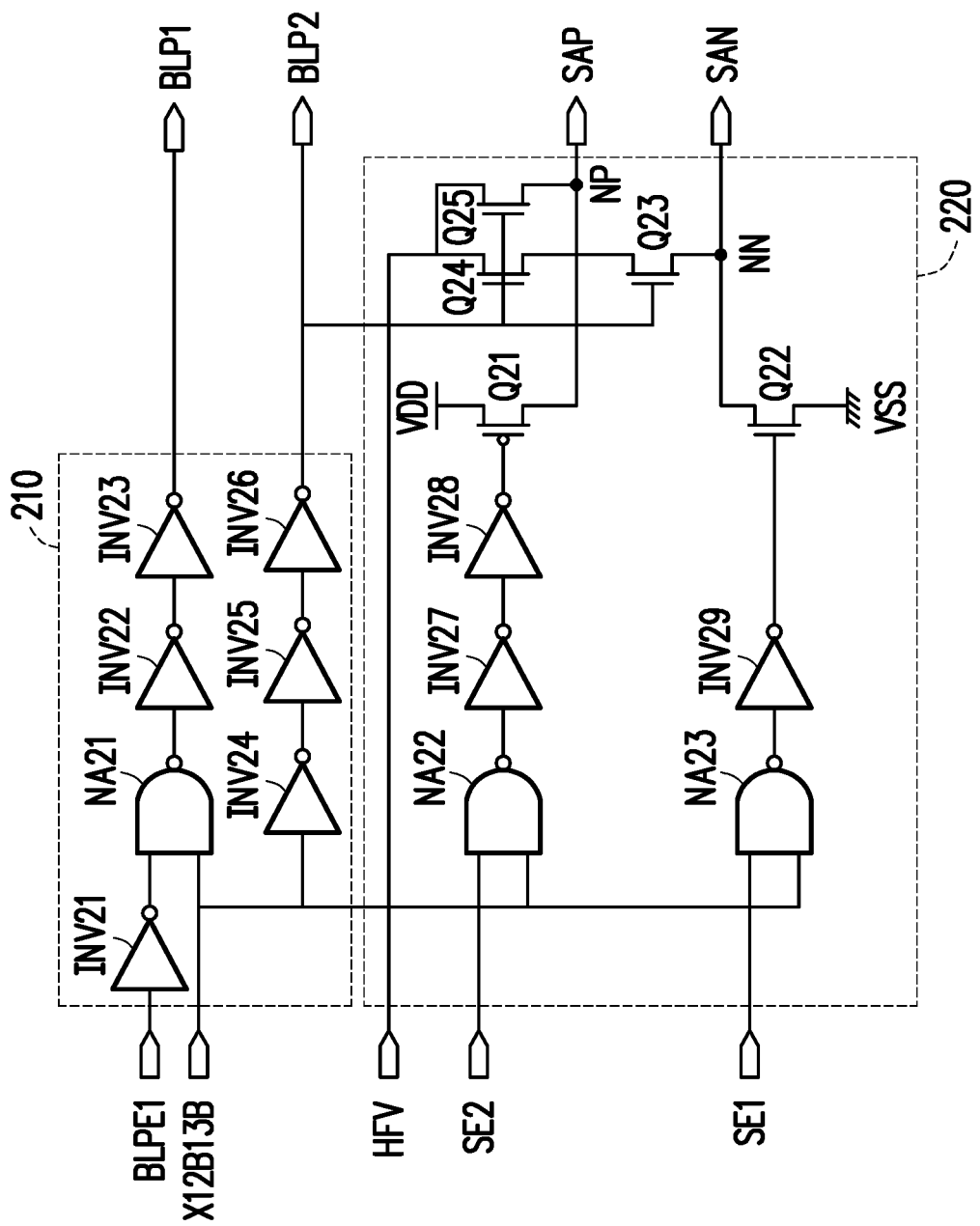
FIG. 4 is a schematic circuit diagram of a sense control circuit according to an embodiment of the disclosure.
Figure 5:
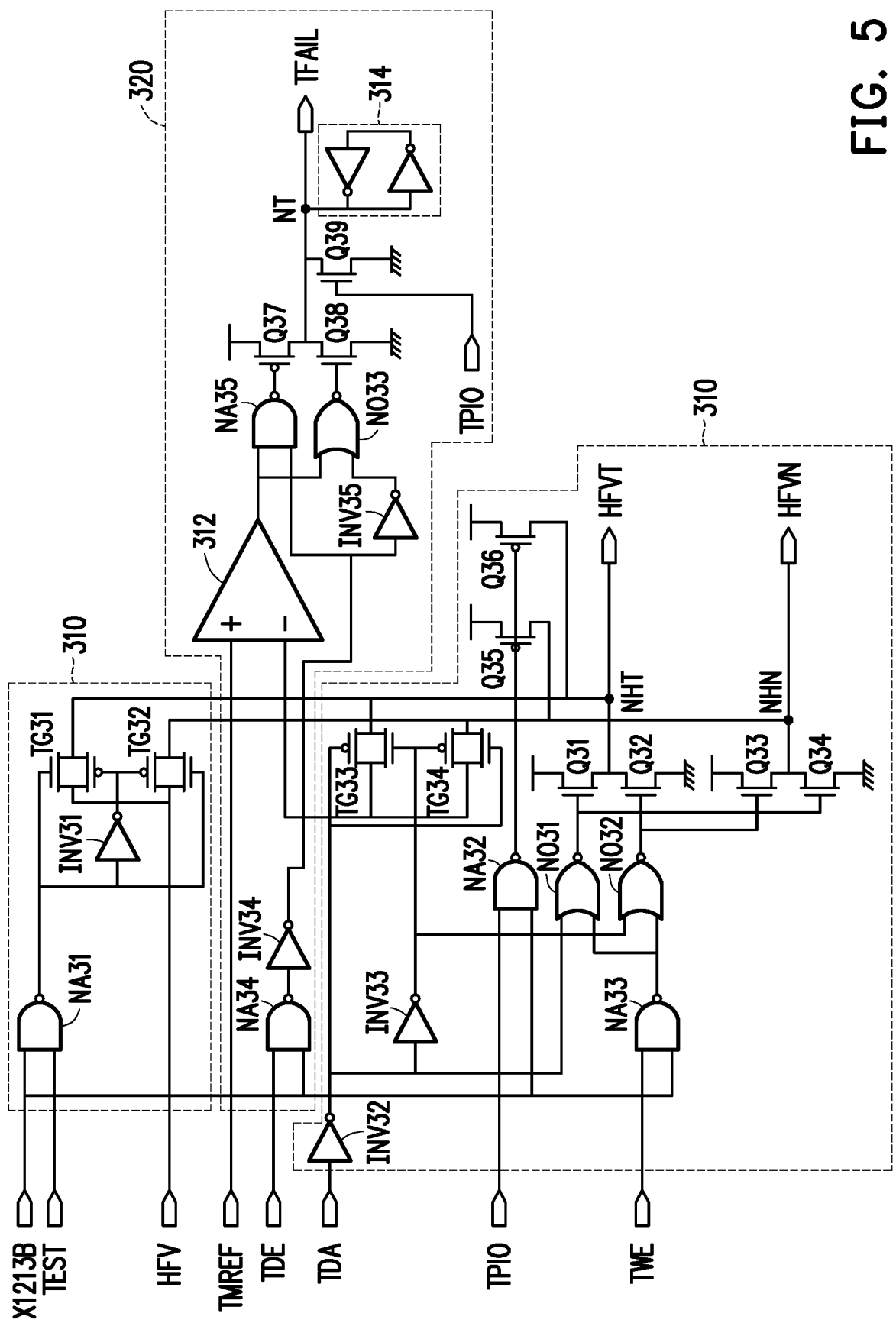
FIG. 5 is a circuit diagram of a test read write circuit according to an embodiment of the disclosure.

FIG. 3 is a schematic block diagram of a control and test circuit according to an embodiment of the disclosure, FIG. 4 is a schematic circuit diagram of a sense control circuit according to an embodiment of the disclosure and FIG. 5 is a circuit diagram of a test read write circuit according to an embodiment of the disclosure. Referring to FIG. 3 through FIG. 5, the control and test circuit 120 includes a sense control circuit 200 and a test read write circuit 300 disposed beside the sense control circuit 200. The sense control circuit 200 and the test read and write circuit 300 are both coupled to the sense amplifier circuit 110 and respectively provide a first precharge enable signal BLP1, a second precharge enable signal BLP2, a p-channel control voltage SAP, an n-channel control voltage SAN, a first precharge voltage HFVT and a second precharge voltage HFVN. In a test mode, the test read write circuit 300 generates a test result TFAIL according to the comparison result of one of the first precharge voltage HFVT and the second precharge voltage HFVN with a test reference voltage TMREF, so as to determine whether there is a memory cell MC failure or not. The following embodiment will elaborate the mechanism for determining whether there is a memory cell MC failure or not.

In this embodiment, the sense control circuit 200 includes a precharge enable control circuit 210 and a sense amplifier voltage control circuit 220. The precharge enable control circuit 210 is, for example, formed by a plurality of inverters INV21 to INV26 and a NAND gate NA21 connected together.

Specifically, an input end of the inverter INV21 receives a precharge enable signal BLPE1, and the precharge enable signal BLPE1 is adapted to determine when to start precharging the bit BLT and the complementary bit line BLN. An output end of the inverter INV21 is coupled to one of a plurality of input ends of the NAND gate NA21, and another input end of the NAND gate NA21 receives a column address signal X12B13B. The column address signal X12B13B is adapted to select to act which word line WL. An output end of the NAND gate NA21 is coupled to an input end of the inverter INV22. The inverter INV22 is connected in series with the inverter INV23. The inverter INV23 outputs the first precharge enable signal BLP1. The inverter INV24, the inverter INV25 and the inverter INV26 are sequentially connected in series. The inverter INV24 receives the column address signal X12B13B, and the inverter INV26 outputs the second precharge enable signal BLP2.

As such, the precharge enable control circuit 210 is coupled to the sense amplifier circuit 110 and generates the first precharge enable signal BLP1 and the second precharge enable signal BLP2 according to the precharge enable signal BLPE1 and the column address signal X12B13B for providing the first precharge enable signal BLP1 and the second precharge enable signal BLP2 to the sense amplifier circuit 110. When performing the test write operation and the test read operation on the memory cell MC, the precharge enable control circuit 210 may control the first precharge enable signal BLP1 to switch the voltage level to make the logic level of the second precharge enable signal BLP2 different from the logic level of the first precharge enable signal BLP1. After the test write operation and the test read operation are completed, the precharge enable control circuit 210 switches the voltage level of the second precharge enable signal BLP2 to make the voltage level of the second precharge enable signal BLP2 same as the logic level of the first precharge enable signal BLP1 again.

In addition, the sense amplifier voltage control circuit 220 is formed by a plurality of inverters INV27 to INV29, a plurality of NAND gates NA22 and NA23 and a plurality of switches Q21 to Q25 connected together. Wherein the above mentioned plurality of switches Q21 to Q25 are implemented as way of transistors to respectively switch a voltage level of a SAP output node NP and a SAN output node NN between the precharge reference voltage HFV, a supply voltage VDD and a ground voltage VSS. The SAP output node NP and the SAN output node NN may output the p-channel control voltage SAP and the n-channel control voltage SAN.

Specifically, the NAND gate NA22 and the NAND gate NA23 receive the column address signal X12B13B, and another input end of the NAND gate NA22 and the NAND gate NA23 respectively receive a sense enable signal SE2 and a sense enable signal SE1. The NAND gate NA22, the inverter INV27 and the inverter INV28 are sequentially connected in series. The switch Q21 is controlled by an output signal of the inverter INV28, and a first end of the switch Q21 receives the supply voltage VDD, a second end of the switch Q21 is coupled to the SAP output node NP to pull up the p-channel control voltage SAP to the supply voltage VDD.

The NAND gate NA23 is connected in series with the inverter INV29. The switch Q22 is controlled by an output signal of the inverter INV29, and a first end of the switch Q22 is coupled to the SAN output node NN, a second end of the switch Q22 is coupled to the ground voltage VSS to pull down the n-channel control voltage SAN to the ground voltage VSS.

The switch Q23, the switch Q24 and the switch Q25 are all controlled by the second precharge enable signal BLP2. Herein, a first end of the switch Q24 and a first end of the switch Q25 receive the precharge reference voltage HFV, and the precharge reference voltage HFV is lower than the supply voltage VDD. In general, a voltage value of the precharge reference voltage HFV is substantially half of the supply voltage VDD. A second end of the switch Q24 is coupled to a first end of the switch Q23, and a second end of the switch Q25 is coupled to the SAP output node NP. A second end of the switch Q23 is coupled to the SAN output node NN. The switches Q23 to Q25 are adapted to restore the voltage level of the p-channel control voltage SAP to the precharge reference voltage HFV during an enabling period of the second precharge enable signal BLP2 (For example, as n-channel transistors are taken as an example of the switches Q23 to Q25 herein, the enabling period of the second precharge enable signal BLP2 is in high level state).

The test read write circuit 300 includes a precharge voltage control circuit 310 and a test compare circuit 320. The precharge voltage control circuit 310 is coupled to the test compare circuit 320 and the sense amplifier circuit 110. For example, the precharge voltage control circuit 310 includes a plurality of inverters INV31 to INV33, a plurality of NAND gates NA31 to NA33, a plurality of NOR gates NO31 and NO32, a plurality of switches Q31 to Q36 and a plurality of transmission gates TG31 to TG34. The test comparison circuit 320 includes a comparator 312, a plurality of inverters INV34 and INV35, a plurality of NAND gates NA34 and NA35, a NOR gates NO33 and a plurality of switches Q37 to Q39. In this embodiment, the plurality of switches Q31 to Q39 and the plurality of transmission gates TG31 to TG34 are implemented as way of CMOS transistors, but the disclosure is not limited thereto.

In this embodiment, the test comparison circuit 320 further includes a latch circuit 314, but a latch circuit is not necessary. In another embodiment, the test comparison circuit 320 may not include the latch circuit 314.

Specifically, the NAND gate NA31 of the precharge voltage control circuit 310 receives the column address signal X12B13B and a test enable signal TEST, an output end of the NAND gate NA31 is coupled to the n-channel gate of the inverter INV31, the n-channel gate of the transmission gate TG31 and the n-channel gate of the transmission gate TG32, and an output end of the INV31 is coupled to the p-channel gate of the transmission gate TG31 and the p-channel gate of the transmission gate TG32. An end of the transmission gate TG31 and an end of the transmission gate TG32 receives the precharge reference voltage HFV, and the other end of the transmission gate TG31 and the other end of the transmission gate TG32 are respectively coupled to a HFVT output node NHT and a HFVN output node NHN, wherein the HFVT output node NHT and the HFVN output node NHN respectively provide the first precharge voltage HFVT and the second precharge voltage HFVN to the sense amplifier circuit 110. Herein, the transmission gate TG31 and the transmission gate TG32 are turned on at the same time or turned off at the same time. When the transmission gate TG31 and the transmission gate TG32 are turned on, the HFVT output node NHT and the HFVN output node NHN receive the precharge reference voltage HFV at the same time.

The inverter INV32 receives a test data signal TDA, and an output end of the inverter INV32 is coupled to a p-channel gate of the transmission gate TG33, an n-channel gate of the transmission gate TG34, an input end of the inverter INV33, and one of a plurality of input ends of the NOR gate NO31. The output end of the inverter INV33 is coupled to an n-channel gate of the transmission gate TG33, a p-channel gate of the transmission gate TG34, and one of a plurality of input ends of the NOR gate NO32. An end of the transmission gate TG33 and an end of the transmission gate TG34 are respectively coupled to the HFVT output node NHT and the HFVN output node NHN, and the other end of the transmission gate TG33 and the other end of the transmission gate TG34 are both coupled to an inverting input end of the comparator 312 of the comparison circuit 320 for providing one of the first precharge voltage HFVT and the second precharge voltage HFVN to the comparator 312.

The NAND gate NA32 receives the column address signal X12B13B and a test data line precharge signal TPIO. An output end of the NAND gate NA32 controls whether the switch Q35 and the switch Q36 are turned on, a first end of the switch Q35 and a first end of the switch Q36 receive the supply voltage VDD, a second end of the switch Q35 is coupled to the HFVN output node NHN, and a second end of the switch Q36 is coupled to the HFVT output node NHT. Therefore, during an enabling period of the test data line precharge signal TPIO (in high level herein, for example) the voltage value of the first precharge voltage HFVT and the voltage value of the second precharge voltage HFVN are pulled up to the supply voltage VDD.

The NAND gate NA33 receives the column address signal X12B13B and a test write enable signal TWE, and an output end of the NAND gate NA33 is coupled to another input end of the NOR gate NO31 and another input end of the NOR gate NO32. An output end of the NOR gate NO31 controls whether the switch Q31 and the switch Q34 are turned on or not, and an output end of the NOR gate NO32 controls whether the switch Q32 and the switch Q33 are turned on or not, wherein a first end of the switch Q31 receives a voltage source VDD, a second end of the switch Q31 is coupled to a second end of the switch Q32 and the HFVT output node NHT, and a second end of the switch Q32 is coupled to the ground voltage VSS. As such, the voltage level of the first precharge voltage HFVT may become a voltage obtained by subtracting a threshold voltage of the switch Q31 from the ground voltage VSS or the voltage source VDD. A first end of the switch Q33 receives the voltage source VDD, a second end of the switch Q33 is coupled to a first end of the switch Q34 and the HFVN output node NHN, and a second end of the switch Q34 is coupled to the ground voltage VSS. As such, the voltage level of the second precharge voltage HFVN may become a voltage obtained by subtracting a threshold voltage of switch Q33 from the ground voltage VSS or the voltage source VDD.

Therefore, the precharge voltage control circuit 310 generates the first precharge voltage HFVT and the second precharge voltage HFVN according to the precharge reference voltage HFV and also receives the test write enable signal TWE and the test data signal TDA, such that the first precharge voltage HFVT and the second precharge voltage HFVN may be the supply voltage VDD, the voltage obtained by subtracting a threshold voltage of the transistor from the voltage source VDD, the ground voltage VSS or the precharge reference voltage HFV.

Specifically, the NAND gate NA34 of the test comparison circuit 320 receives and outputs the column address signal X12B13B and the test data enable signal TDE to the inverter INV34. An output end of the inverter INV34 is coupled to an input end of the inverter INV35 and one of a plurality of input ends of the NAND gate NA35, and an output end of the inverter INV35 is coupled to one of a plurality of input ends of the NOR gate NO33. A non-inverting input end of the comparator 312 receives the test reference voltage TMREF. An inverting input end of the comparator 312 receives one of the first precharge voltage HFVT and the second precharge voltage HFVN from the transmission gate TG33 or the transmission gate TG34. An output end of the comparator 312 is coupled to another input end of the NAND gate NA35 and another input end of the NOR gate NO33. Herein, the test reference voltage TMREF is a preset fixed voltage value, this voltage value is greater than half of the supply voltage VDD or greater than the precharge reference voltage HFV, and is less than the supply voltage VDD. For example, the test reference voltage TMREF may be three fourths of the supply voltage VDD.

The switch Q37 is controlled by an output result of the NAND gate NA35. The first end of the switch Q37 is coupled to the supply voltage VDD, and the second end of the switch Q37 is coupled to the test node NT. The test node NT outputs a test result TFAIL. The switch Q38 is controlled by an output result of the NOR gate NO33. The first end of the switch Q38 is coupled to the test node NT, and the second end of the switch Q38 is coupled to the ground voltage VSS. Therefore, a voltage level of the test result TFAIL may be changed to either the supply voltage VDD or the ground voltage VSS according to the output result of the comparator 312.

In addition, a first end of the switch Q39 is also coupled to the test node NT. The second end of the switch Q39 is coupled to the ground voltage VSS and is controlled by the test data line precharge signal TPIO for pulling down the voltage level of the test result TFAIL to the ground voltage VSS during the enabling period of the test data line precharge signal TPIO. The latch circuit 314 is also coupled to the test node NT for latching the voltage level of the test result TFAIL.

In brief, the test comparison circuit 320 compares one of the first precharge voltage HFVT and the second precharge voltage HFVN with the test reference voltage TMREF to generate the test result TFAIL, so as to determine whether there is a memory cell MC failure or not. if one of the first precharge voltage HFVT and the second precharge voltage HFVN is greater than the test reference voltage TMREF, the test result TFAIL is, for example, substantially equal to one of the supply voltage VDD and the ground voltage VSS, so as to indicate a successful data sensing of the memory cell MC. If both of the first precharge voltage HFVT and the second precharge voltage HFVN are smaller than the test reference voltage TMREF, the test result TFAIL is, for example, substantially equal to one of the supply voltage VDD or the ground voltage VSS, so as to indicate a fail data sensing of the memory cell MC. The following embodiments will further detail the read-write test and determining whether there is a memory cell MC failure or not.

Figure 6:
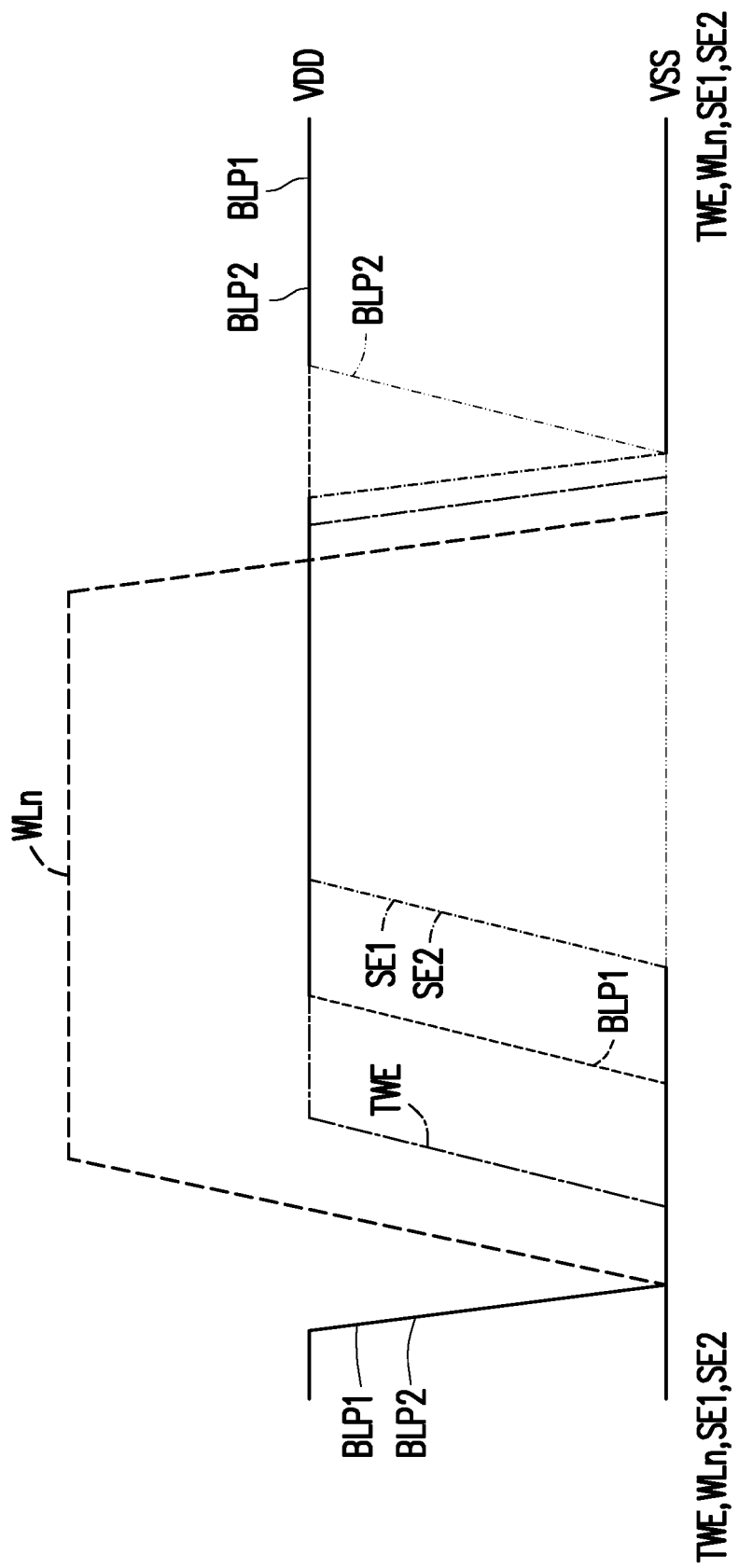
FIG. 6 to FIG. 8 are respectively waveform diagram of a test write operation of logic "0" and logic "1" of a memory device according to an embodiment of the disclosure.
Figure 7:
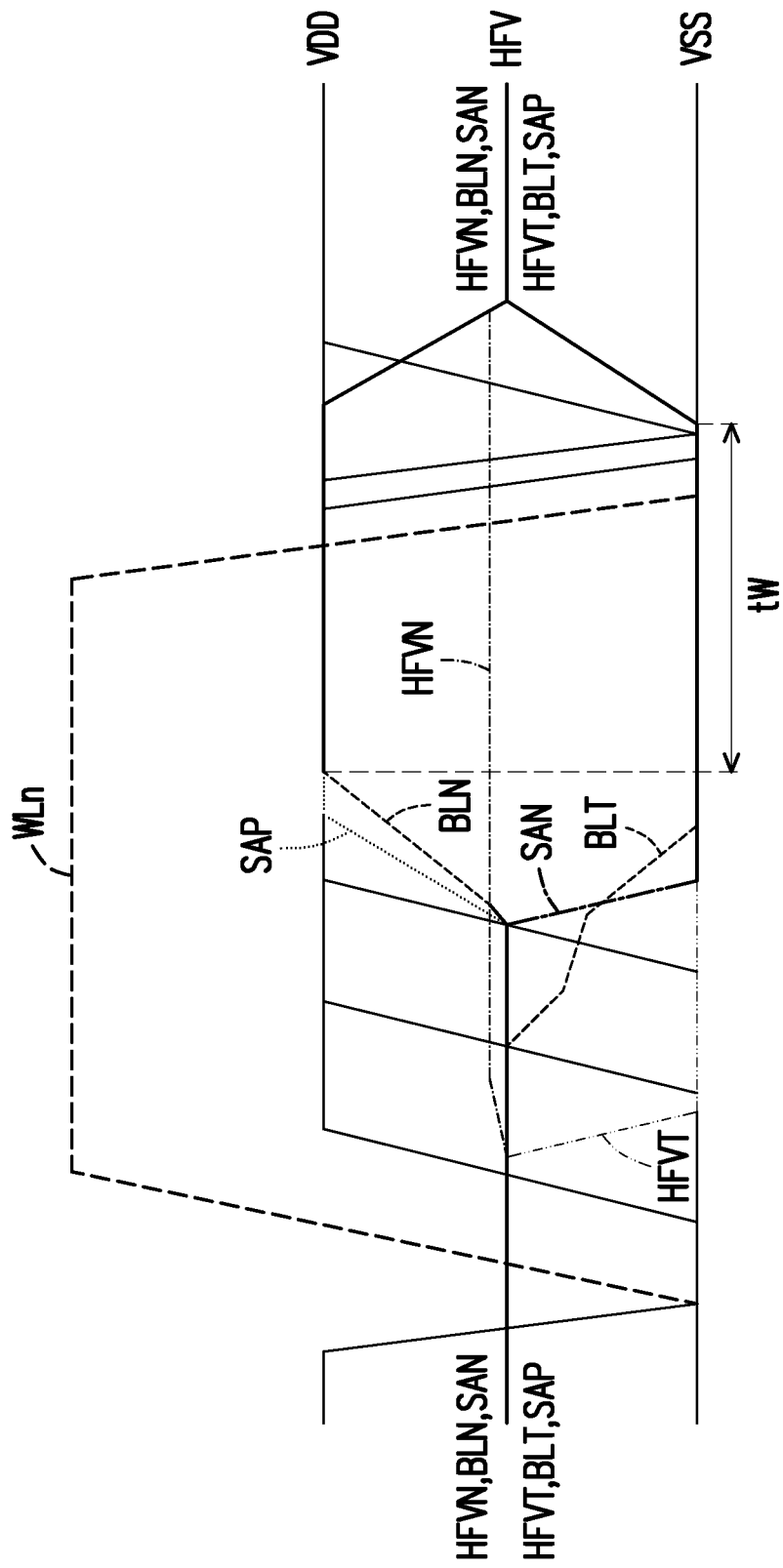
Figure 8:
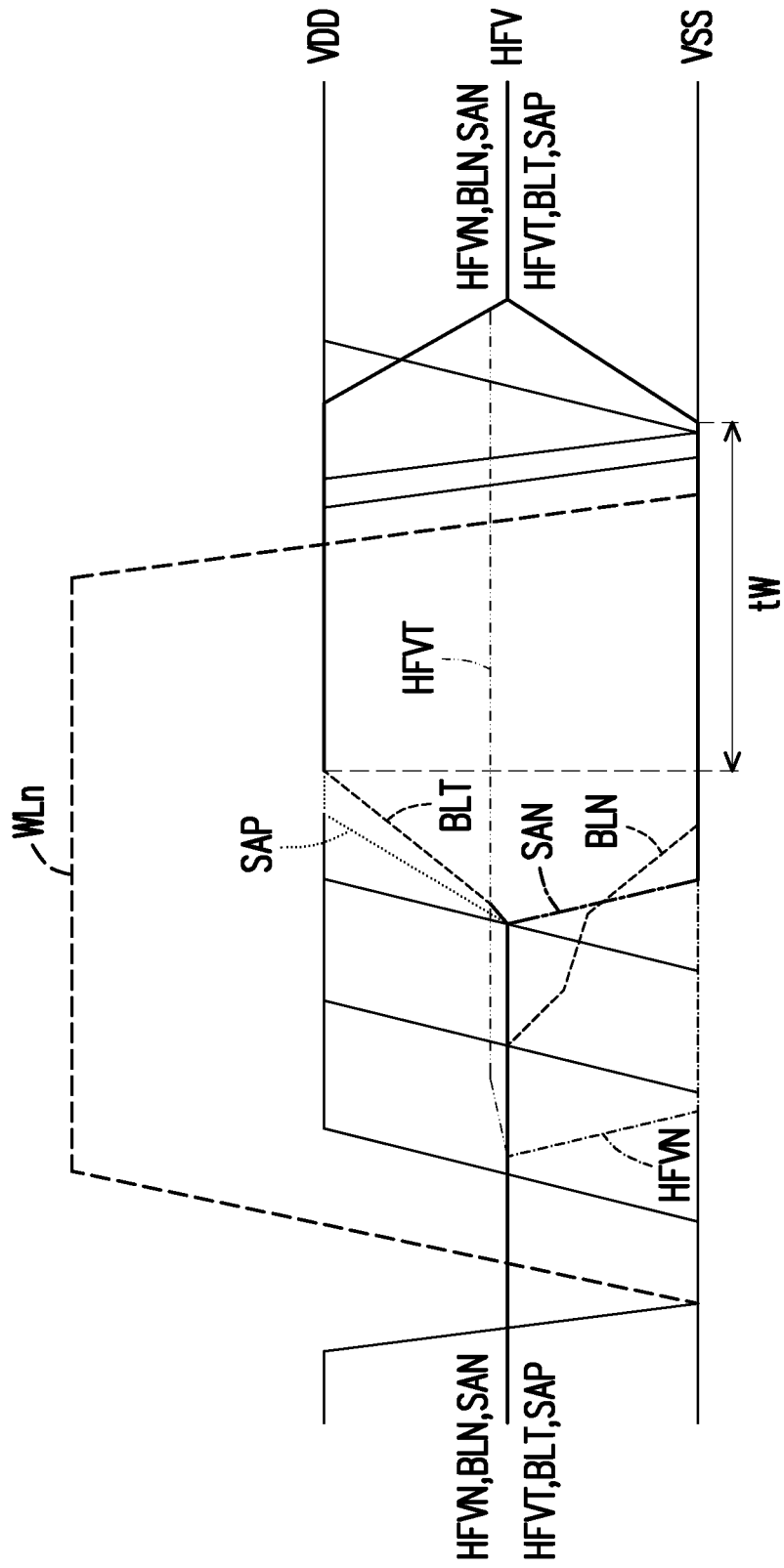

FIG. 6 to FIG. 8 are respectively waveform schematic of a test write operation of logic "0" and logic "1" of a memory device according to an embodiment of the disclosure. In the test write operation, taking any one memory cell MC as an example, FIG. 6 shows the waveforms of the word line signal WLn on the word line WL, the test write enable signal TWE, the sense enable signals SE1 and SE2, and the operation waveform of the first precharge enable signal BLP1 and the second precharge enable signal BLP2. It should be particularly noted that, the thin straight line segments shown in FIG. 7 and FIG. 8 without reference numerals indicate the waveforms shown in FIG. 6, of which the reference numerals are omitted for clarity of the figure. Those skilled in the art should be able to know the meaning of these thin straight line segments with reference to FIG. 6.

Referring to FIG. 6 and FIG. 7 with reference to FIG. 1 to FIG. 5, before being tested, the first precharge voltage HFVT and the second precharge voltage HFVN have a voltage value maintained at the voltage value of the precharge reference voltage HFV because the transmission gate TG31 and the transmission gate TG32 are turned on. In the test write operation, especially during a test write sensing period tW, the voltage value of one of the first precharge voltage HFVT and the second precharge voltage HFVN is smaller than the supply voltage VDD but greater than the precharge reference voltage HFV, and the voltage value of the other is smaller than the precharge reference voltage HFV, for example, substantially equal to the ground voltage VSS.

First of all, taking the data representing the logic "0" that are intended to be written to the memory cell MC as an example, the test data signal TDA is set to be in low level state, and at this moment, the word line signal WLn and the voltage of the test write enable signal TWE are in the high level state. Hence, the switch Q31 and the switch Q34 are turned off, and the switch Q32 and the switch Q33 are turned on. Herein, n-channel transistors are taken as an example of the switches Q31 to Q34 herein, but the disclosure is not limited thereto. As such, the voltage of the first precharge voltage HFVT provided by the precharge voltage control circuit 310 is pulled down to the ground voltage VSS, and the voltage of the second precharge voltage HFVN is pulled up to voltage value obtained by subtracting the threshold voltage VTN of the n-channel transistor from the supply voltage VDD. It should be noted that, the voltage value of the supply voltage VDD is greater than a total of the voltage value of the precharge reference voltage HFV and the threshold voltage VTN.

Then, the precharge enable control circuit 210 switches the first precharge enable signal BLP1 from the original low level state to high level state, but the second precharge enable signal BLP2 maintains in low level state, such that the first switch T1 and the second switch T2 are turned on, and the third switch T3 is turned off, and thus the bit line BLT and the complementary bit line BLN may respectively receive the first precharge voltage HFVT and the second precharge voltage HFVN.

It should be particularly noted that, in this embodiment, when performing the test write operation on the memory cell MC and before the first precharge enable signal BLP1 is switched to the enable state, i.e. before the first switch T1 and the second switch T2 are turned on, the first precharge voltage HFVT and the second precharge voltage HFVN have already had different voltage levels.

Then, the sense amplifier voltage control circuit 220 switches the p-channel control voltage SAP and the n-channel control voltage SAN from the precharge reference voltage HFV to the supply voltage VDD and the ground voltage VSS, respectively. The voltage level of the p-channel control voltage SAP and the voltage level of the n-channel control voltage SAN are originally kept lower than the supply voltage VDD, which is the same as the precharge reference voltage HFV herein. During an enabling period of the sense enable signal SE1 and the sense enable signal SE2, the switch Q21 and the switch Q22 are turned on, and the p-channel control voltage SAP and the n-channel control voltage SAN are respectively switched to the supply voltage VDD and the ground voltage VSS, so as to amplify the voltage difference between the bit line BLT and the complementary bit line BLN. Therefore, during the test write sensing period tW, the voltage level of the bit line BLT is substantially equal to the ground voltage VSS, and the voltage level of the complementary bit line BLN is the supply voltage VDD, such that the memory cell MC stores the data representing logic "0".

Then, referring to FIG. 6 and FIG. 8 with reference to FIG. 1 to FIG. 5, FIG. 8 shows the waveforms of the test write operation, the first precharge voltage HFVT, the second precharge voltage HFVN, the p-channel control voltage SAP and the n-channel control voltage SAN during the test write operation when the write data is logic "1". During the test write operation, taking the data representing the logic "1" that are intended to be written to the memory cell MC as an example, the test data signal TDA is set in high level state. During the test write sensing period tW, the voltage value of the first precharge voltage HFVT output by the precharge voltage control circuit 310 is pulled up to the voltage value obtained by subtracting the threshold voltage VTN of the n-channel transistor from the supply voltage VDD, and the voltage level of the second precharge voltage HFVN is pulled down to the ground voltage VSS. Those skilled in the art should be able to obtain sufficient teachings and suggestions for the detailed implementations based on the aforementioned embodiments and the general knowledge, so no further details are provided herein.

Figure 9:
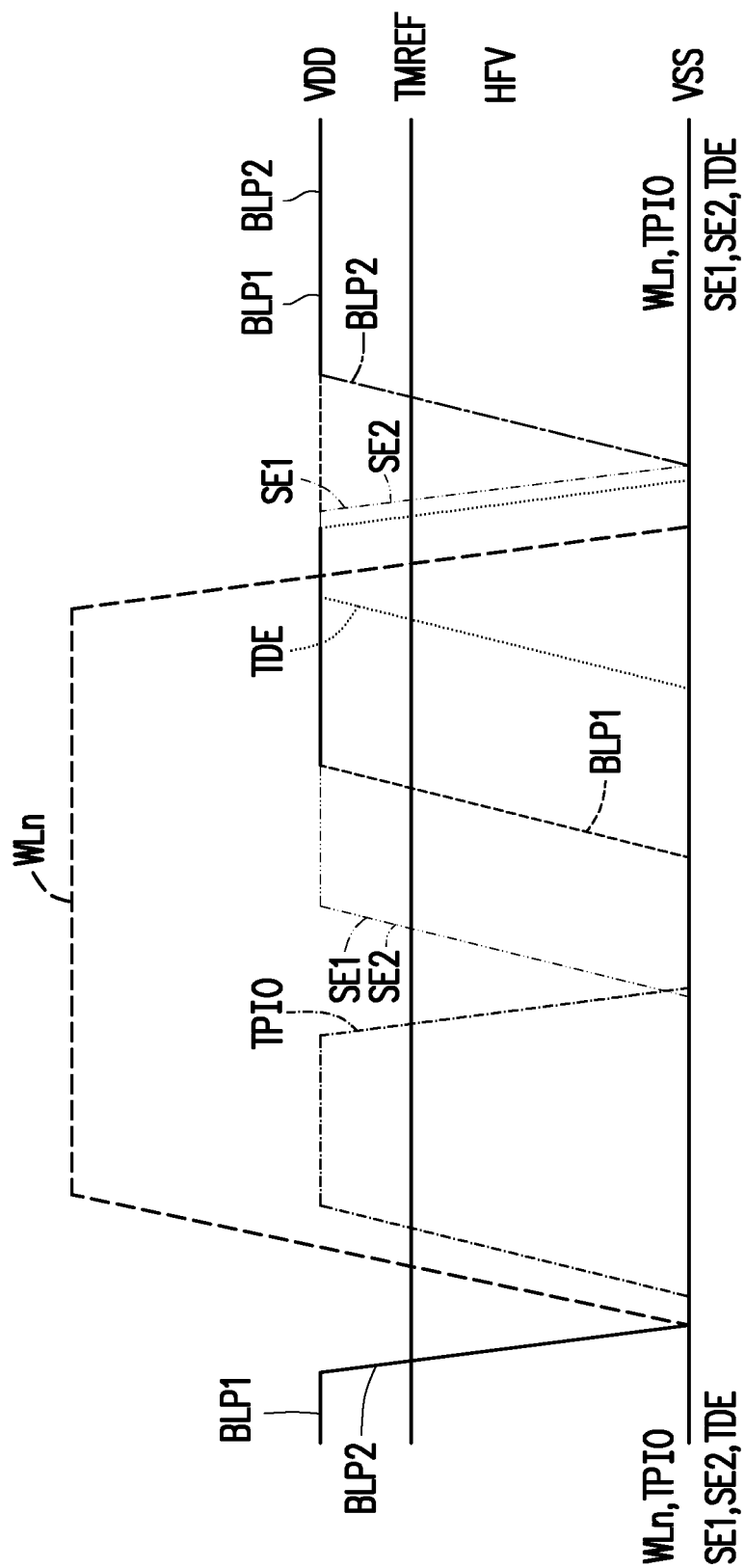
FIG. 9 to FIG. 11 are respectively waveform diagram of a test read operation of a memory device according to an embodiment of the disclosure.
Figure 10:
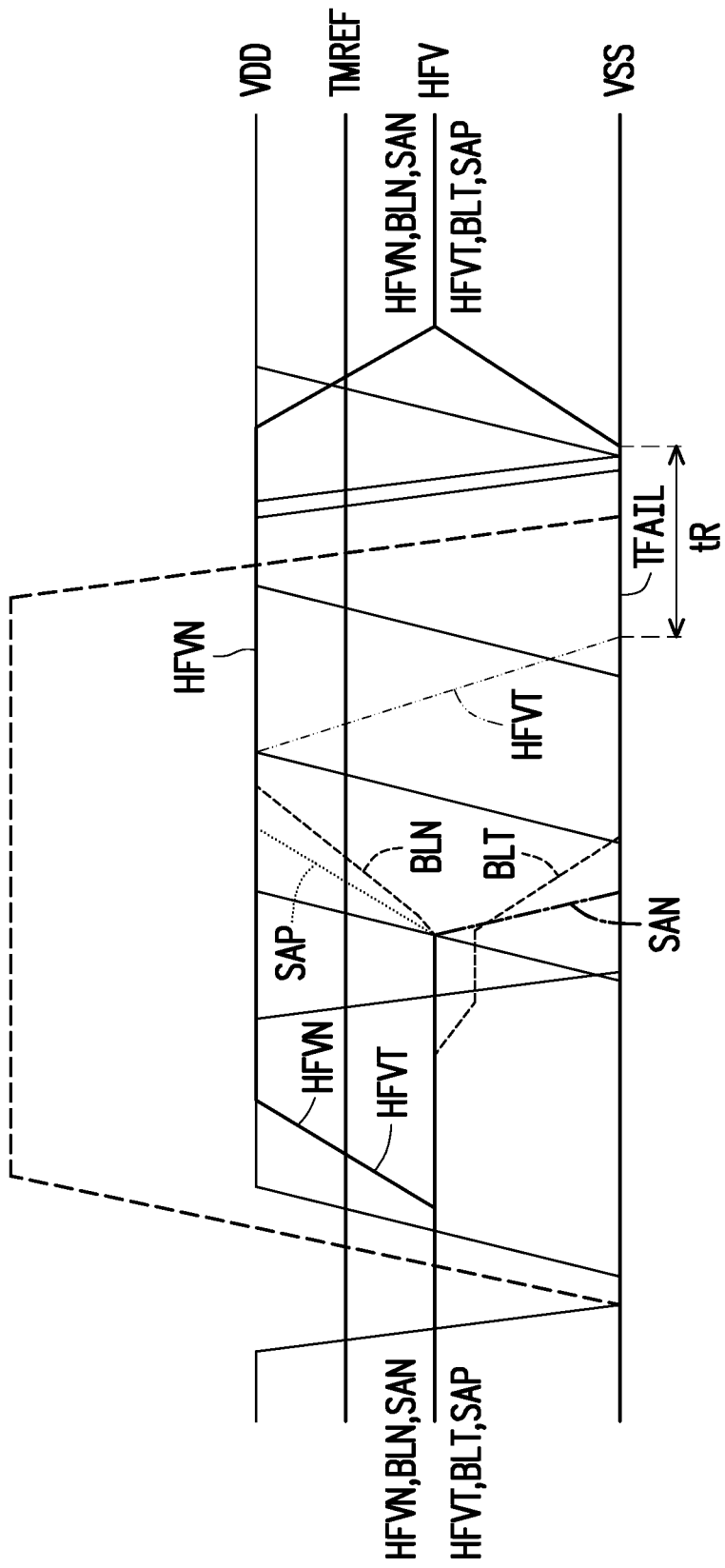
Figure 11:
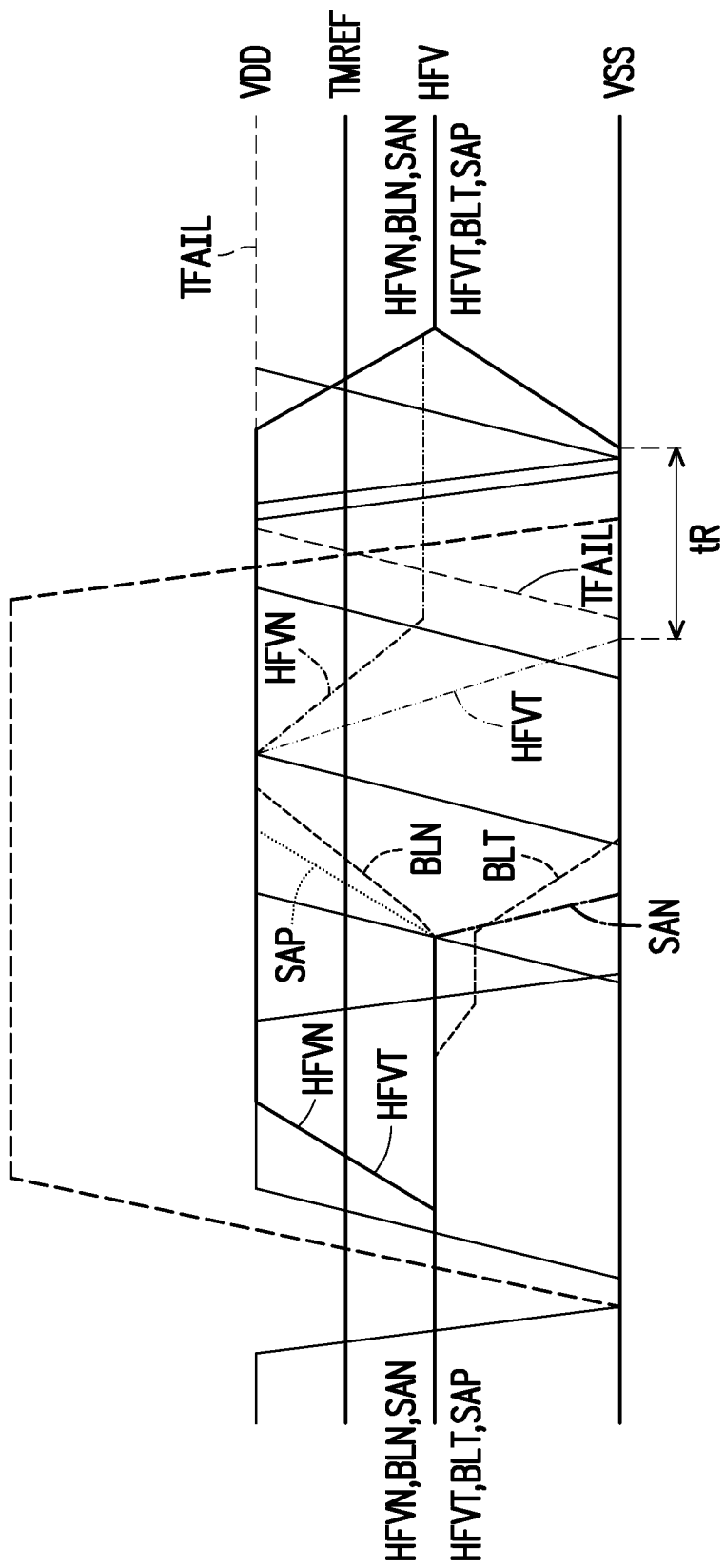

FIG. 9 to FIG. 11 are respectively waveform schematic of a test read operation of a memory device according to an embodiment of the disclosure. During the test read operation, taking any one of the memory cells MC for example, FIG. 9 shows the waveforms of the word line signal WLn, the sense enable signal SE1, the sense enable signal SE2, the test data line precharge signal TPIO, the test data enable signal TDE, the first precharge enable signal BLP1 and the second precharge enable signal BLP2. It should be particularly noted that, the thin straight line segments shown in FIG. 10 and FIG. 11 without reference numerals indicate the waveforms shown in FIG. 9, of which the reference numerals are omitted for clarity of the figure. Those skilled in the art should be able to know the meaning of these thin straight line segments with reference to FIG. 9.

Referring first to FIG. 9 and FIG. 10, before being tested, the first precharge voltage HFVT and the second precharge voltage HFVN have a voltage value maintained at the voltage value of the precharge reference voltage HFV because the transmission gate TG31 and the transmission gate TG32 are turned on.

When performing test read operation on the memory cell MC, taking reading the data representing logic "0" for example, when the word line signal WLn is in high level state and before a test read sensing period tR, a data line precharge operation is performed first, i.e. during the enabling period of the data line precharge signal TPIO, the switch Q35, the switch Q36 and the switch Q39 are turned on, such that the first precharge voltage HFVT and the second precharge voltage HFVN are pulled up to be substantially equal to the supply voltage VDD, and the test node NT substantially receives the ground voltage VSS. Herein, p-channel transistors are taken as an example of the switch Q35 and the switch Q36, and an n-channel transistor is taken as an example of the switch Q39.

After the data line precharge operation is completed, the test data line precharge signal TPIO is disabled (for example, changed to low level state) and the sense enable signal SE1 and the sense enable signal SE2 are enabled, such that the p-channel control voltage SAP and the n-channel control voltage SAN are respectively switched from the precharge reference voltage HFV to the supply voltage VDD and the ground voltage VSS.

Then, the first precharge enable signal BLP1 is switched from the original low level state to high level state, but the second precharge enable signal BLP2 maintains in low level state. The first precharge enable signal BLP1 that is switched to high level makes the first switch T1 and the second switch T2 turned on. If all the data on the memory cell MC on the same word line WL are successfully sensed, during the test read sensing period tR, the voltage level of the first precharge voltage HFVT and the second precharge voltage HFVN are different, and the voltage level of one of the first precharge voltage HFVT and the second precharge voltage HFVN is maintained at the supply voltage VDD, and the voltage level of the other is pulled down to be substantially equal to the ground voltage VSS. In the embodiment of FIG. 9, it is taken as an example that the second precharge voltage HFVN is maintained at the supply voltage VDD and the first precharge voltage HFVT is pulled down to the ground voltage VSS.

It should be particularly noted that, during the test write operation and the test read operation, the first precharge enable signal BLP1 is switched from low level state to high level state at different time points. Specifically, when performing the test write operation, the first precharge enable signal BLP1 is switched to a different voltage level at a time point earlier than the time point when the first precharge enable signal BLP1 is switched to a different voltage level when performing the test read operation. In the test write operation, the first precharge enable signal BLP1 is switched to high level at a time point earlier than the time point when the sense enable signal SE1 and the sense enable signal SE2 are switched to high level. However, in the test read operation, the first precharge enable signal BLP1 is switched to high level at a time point later than when the sense enable signal SE1 and the sense enable signal SE2 are switched to high level.

Then, the comparator 312 receives one of the test reference voltage TMREF, the first precharge voltage HFVT and the second precharge voltage HFVN, for example, the one having the highest voltage level. Therefore, in this embodiment, the comparator 312 receives the test reference voltage TMREF and the second precharge voltage HFVN, wherein the voltage value of the test reference voltage TMREF is preset as three fourths of the supply voltage VDD, and the second precharge voltage HFVN is substantially equal to the supply voltage VDD at this moment. During the test read sensing period tR, since the second precharge voltage HFVN is greater than the test reference voltage TMREF, the test result TFAIL is set to be in low voltage level, for example, substantially equal to the ground voltage VSS, indicating that all the data on the memory cell MC on the same word line WL. MC are successfully sensed.

Referring to FIG. 9 and FIG. 11, if the data on the memory cell MC on the same word line WL fail to be sensed, after the first precharge enable signal BLP1 is switched to high level so that the first switch T1 and the second switch T2 are turned on, the voltage of the signals of the first precharge voltage HFVT and the second precharge voltage HFVN that are originally in high level state is pulled down by the ground voltage VSS and thus become smaller than the original voltage level.

In this embodiment, the second precharge voltage HFVN is originally in high level state and the voltage value thereof is substantially equal to the supply voltage VDD, and the voltage value of the first precharge voltage HFVT is substantially equal to the ground voltage VSS. During the test read sensing period tR, after the first switch T1 and the second switch T2 are turned on, the first precharge voltage HFVT is still equal to the ground voltage VSS, but the second precharge voltage HFVN is pulled down to a value close to half of the supply voltage VDD. Specifically, the voltage of the second precharge voltage HFVN decreases to a voltage value obtained by subtracting the threshold voltage VTN of the n-channel transistor from the supply voltage VDD. In an embodiment, the supply voltage VDD is 1.5V, and the threshold voltage VTN of the n-channel transistor is 0.7V, so the voltage of the second precharge voltage HFVN after decreasing is close to half of the supply voltage VDD.

Then, the comparator 312 receives the test reference voltage TMREF and the second precharge voltage HFVN for performing comparison. The voltage value of the test reference voltage TMREF is preset as three fourths of the supply voltage VDD, and the voltage value of the second precharge voltage HFVN is close to half of the voltage value VDD at the moment which is smaller than the test reference voltage TMREF. As such, the test result TFAIL is set to be changed to high voltage level, for example, substantially equal to the supply voltage VDD, indicating that there is a sensing failure on the memory cell MC on the same word line WL.

In the embodiments of FIG. 9 to FIG. 11, when the test read operation is performed on the memory cell MC, during the test read sensing period tR, the voltage value of one of the first precharge voltage HFVT and the second precharge voltage HFVN is not greater than the supply value VDD but is greater than the precharge reference voltage HFV, and the voltage value of the other is lower than the precharge reference voltage HFV, for example, equal to the ground voltage VSS.

In another embodiment, the first precharge voltage HFVT may be in high level state, and the comparator 312 may receive the test reference voltage TMREF and the first precharge voltage HFVT for performing comparison. Detailed implementation manners are known to those skilled in the art from the above. The explanations and general knowledge gained sufficient instruction and will not be repeated here. Those skilled in the art should be able to obtain sufficient teachings for the detailed implementations based on the aforementioned explanations and the general knowledge, so no further details are provided herein.

Figure 12:
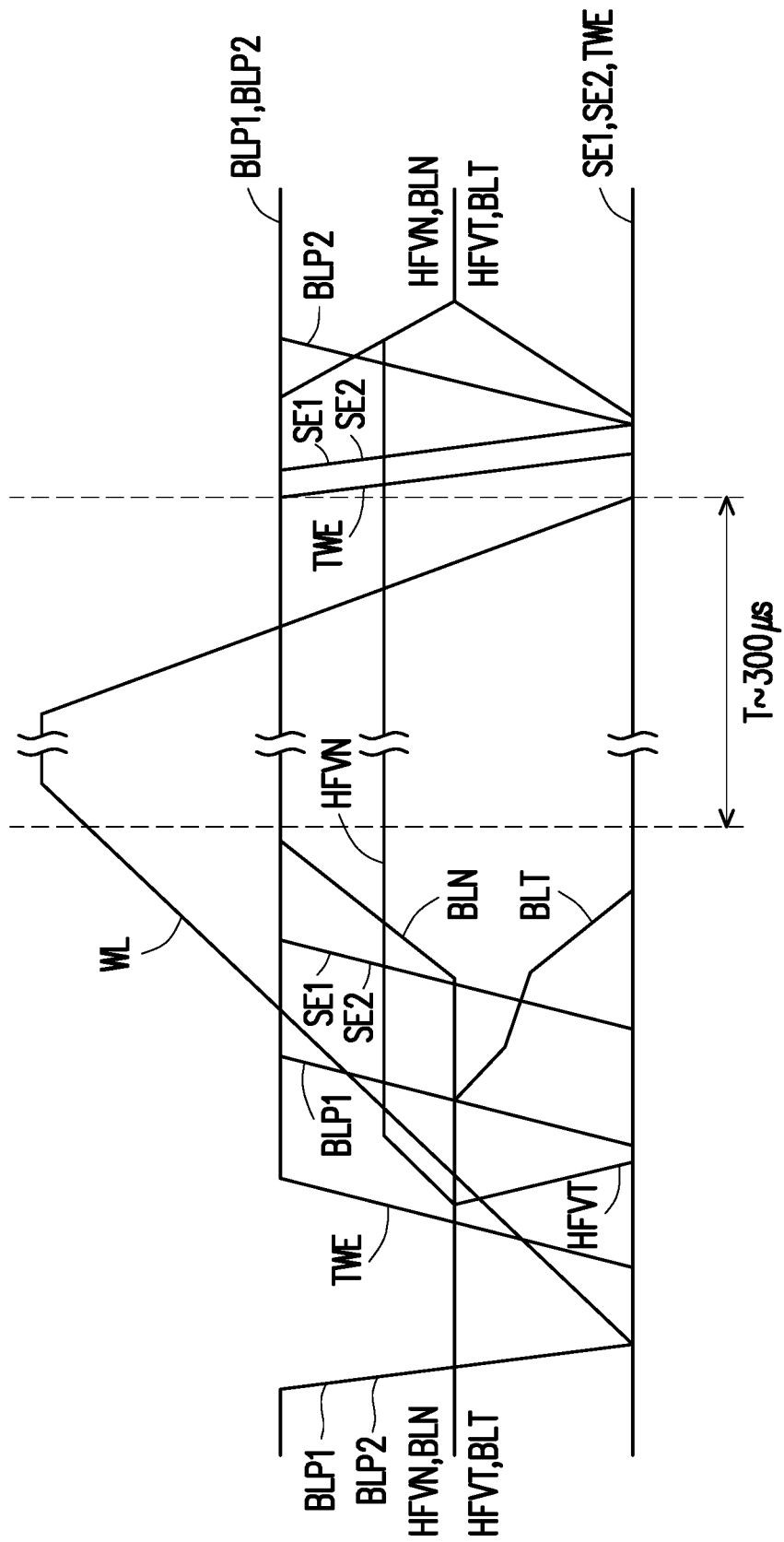
FIG. 12 is an operation waveform diagram of a memory device writing logic "0" to all memory cells according to another embodiment of the disclosure.

FIG. 12 is a schematic operation waveform of a memory device writing logic "0" to all memory cells according to another embodiment of the disclosure. In the embodiment of FIG. 12, after the memory device 100 is in a power up status or in a RESET status, the memory device 100 performs the write operation on all of the word lines WL in the memory device 100 and all the sense amplifier circuit 110 connected to the word lines WL within an extend write cycle T, for example, in a range less than 200 microseconds to 300 microseconds. In the embodiment of FIG. 12, taking an extend write cycle T of approximately 300 microseconds as an example, the write operation is performed on all of the word lines WL on the memory device 100 and all of the sense amplifier circuits 110 connected to the word lines WL, as represented by the omission mark in FIG. 12. In other words, the memory device 100 of this embodiment is able to write the data logic "0" to the memory cells MC on all of the word lines WL in a very short time. With regard to the implementation of the waveform of FIG. 12, those skilled in the art are able to obtain sufficient suggestions and teachings based on the embodiments of FIG. 6 to FIG. 8, which will not be described herein.

In sum of the foregoing, performing the parallel test mode by selecting multiple sense amplifiers on the word line within one cycle is achieved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
    a precharge voltage control circuit, generating a first precharge voltage and a second precharge voltage based on a precharge reference voltage;
    a sense amplifier circuit, coupled between a bit line and a complementary bit line and configured to sense a data of a memory cell coupled to the bit line, and the sense amplifier circuit is coupled to the precharge voltage control circuit for the bit line and the complementary bit line respectively receiving the first precharge voltage and the second precharge voltage,
    wherein in a precharge operation, a voltage level of the first precharge voltage and a voltage level of the second precharge voltage are the same, and during a test write sensing period and a test read sensing period after the precharge operation, the voltage level of the first precharge voltage and the voltage level of the second precharge voltage provided by the precharge voltage control circuit to the bit line and the complementary bit line are different; and
    a test comparison circuit, coupled to the precharge voltage control circuit and configured to compare one of the first precharge voltage and the second precharge voltage with a test reference voltage for generating a test result,
    wherein if one of the first precharge voltage and the second precharge voltage is greater than the test reference voltage, the test result indicates that the data of the memory cell is successfully sensed, and if both of the first precharge voltage and the second precharge voltage are smaller than the test reference voltage, the test result indicates that the data sensing of the memory cell failed.

2. The memory device according to claim 1, wherein the sense amplifier circuit comprises:
    a first switch, having a first end receiving the first precharge voltage and a second end coupled to the bit line, the first switch is controlled by a first precharge enable signal;
    a second switch, having a first end receiving the second precharge voltage and a second end coupled to the complementary bit line, the second switch is controlled by the first precharge enable signal;
    a third switch, coupled between the bit line and the complementary bit line and controlled by a second precharge enable signal; and
    a sense circuit, coupled between the bit line and the complementary bit line and configured to amplify a voltage difference between the bit line and the complementary bit line.

3. The memory device according to claim 2, wherein during a test write operation performed on the memory cell, the voltage levels of the first precharge voltage and the second precharge voltage are changed to different voltage levels before the first switch and the second switch are turned on.

4. The memory device according to claim 2, further comprising:
    a precharge enable control circuit, coupled to the sense amplifier circuit and configured to generate the first precharge enable signal and the second precharge enable signal based on a precharge enable signal,
    wherein when a test write operation and a test read operation are performed on the memory cell, the first precharge enable signal switches a voltage level thereof to make a logic level of the second precharge enable signal different from a logic level of the first precharge enable signal, and after the test write operation and the test read operation are completed, the second precharge enable signal switches the voltage level thereof for restoring the logic level of the second precharge enable signal to be the same as the logic level of the first precharge enable signal.

5. The memory device according to claim 4, wherein a time point at which the first precharge enable signal switches the voltage level when performing the test write operation is earlier than a time point at which the first precharge enable signal switches the voltage level when performing the test read operation.

6. The memory device according to claim 1, wherein the test reference voltage has a voltage level higher than the precharge reference voltage but lower than a supply voltage.

7. The memory device according to claim 6, wherein if one of the first precharge voltage and the second precharge voltage is greater than the test reference voltage, a voltage value of the test result is substantially equal to one of the supply voltage and a ground voltage, and if both of the first precharge voltage and the second precharge voltage are smaller than the test reference voltage, the voltage value of the test result is substantially equal to the other one of the supply voltage and the ground voltage.

8. The memory device according to claim 1, wherein during the test write sensing period, a voltage value of one of the first precharge voltage and the second precharge voltage is smaller than the supply voltage but greater than the precharge reference voltage, and the voltage value of the other of the first precharge voltage and the second precharge voltage is smaller than the precharge reference voltage.

9. The memory device according to claim 1, wherein when the test read operation is performed on the memory cell, before the test read sensing period, the first precharge voltage and the second precharge voltage are pulled up to be substantially equal to a supply voltage.

10. A method for test reading and writing for a memory device, configured to perform a test write operation and a test read operation on a memory cell, the method for test reading and writing comprises:
    generating a first precharge voltage and a second precharge voltage based on a precharge reference voltage;
    having a bit line and a complementary bit line respectively receive the first precharge voltage and the second precharge voltage,
    wherein in a precharge operation, a voltage level of the first precharge voltage and a voltage level of the second precharge voltage are the same, and during a test write sensing period and a test read sensing period after the precharge operation, the voltage level of the first precharge voltage and the voltage level of the second precharge voltage provided by the precharge voltage control circuit to the bit line and the complementary bit line are different; and comparing one of the first precharge voltage and the second precharge voltage with a test reference voltage for generating a test result, wherein if one of the first precharge voltage and the second precharge voltage is greater than the test reference voltage, the test result indicates that the data of the memory cell is successfully sensed, and if both of the first precharge voltage and the second precharge voltage are smaller than the test reference voltage, the test result indicates that the data sensing of the memory cell failed.

11. The method for test reading and writing according to claim 10, further comprising:

controlling a first switch and a second switch with a first precharge enable signal for determining whether the bit line and the complementary bit line respectively receives the first precharge voltage and the second precharge voltage or not;

controlling a third switch with a second precharge enable signal for determining whether to electrically connect the bit line and the complementary bit line or not; and amplifying a voltage difference between the bit line and the complementary bit line with a sense circuit.

12. The test reading and writing method according to claim 11, wherein during a test write operation performed on the memory cell, changing the voltage levels of the first precharge voltage and the second precharge voltage to different voltage levels before the first switch and the second switch are turned on.

13. The method for test reading and writing according to claim 12, further comprising:

generating the first precharge enable signal and the second precharge enable signal based on a precharge enable signal, wherein when the test write operation and the test read operation are performed on the memory cell, the first precharge enable signal switches a voltage level thereof and a logic level of the second precharge enable signal is different from a logic level of the first precharge enable signal, and after the test write operation and the test read operation are completed, the second precharge enable signal switches the voltage level thereof for restoring the logic level of the second precharge enable signal to be the same as the logic level of the first precharge enable signal.

14. The method for test reading and writing according to claim 13, wherein a time point at which the first precharge enable signal switches the voltage level when performing the test write operation is earlier than a time point at which the first precharge enable signal switches the voltage level when performing the test read operation.

15. The method for test reading and writing according to claim 11, wherein during the test write sensing period, a voltage value of one of the first precharge voltage and the second precharge voltage is smaller than the supply voltage but greater than the precharge reference voltage, and the voltage value of the other of the first precharge voltage and the second precharge voltage is smaller than the precharge reference voltage.

16. The method for test reading and writing according to claim 11, wherein when the test read operation is performed on the memory cell, before the test read sensing period, the first precharge voltage and the second precharge voltage are pulled up to be substantially equal to a supply voltage.

17. The method for test reading and writing according to claim 10, wherein the test reference voltage has a voltage level higher than a voltage level of the precharge reference voltage but lower than a voltage level of a supply voltage.

18. The method for test reading and writing according to claim 17, wherein if one of the first precharge voltage and the second precharge voltage is greater than the test reference voltage, a voltage value of the test result is substantially equal to one of the supply voltage and a ground voltage, and if both of the first precharge voltage and the second precharge voltage are smaller than the test reference voltage, the voltage value of the test result is substantially equal to the other one of the supply voltage and the ground voltage.

* * * * *